(12) United States Patent
Xiao

(10) Patent No.: US 9,153,585 B2
(45) Date of Patent: Oct. 6, 2015

(54) TUNNELING FIELD EFFECT TRANSISTOR DEVICE AND RELATED MANUFACTURING METHOD

(71) Applicant: Semiconductor Manufacturing International (Shanghai) Corporation, Shanghai (CN)

(72) Inventor: Deyuan Xiao, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/490,182

(22) Filed: Sep. 18, 2014

(65) Prior Publication Data

US 2015/0084133 A1 Mar. 26, 2015

(30) Foreign Application Priority Data

Sep. 22, 2013 (CN) .......................... 2013 1 0428652

(51) Int. Cl.
| | |
|---|---|
| *H01L 27/092* | (2006.01) |
| *H01L 21/8258* | (2006.01) |
| *H01L 21/02* | (2006.01) |
| *H01L 29/66* | (2006.01) |
| *H01L 29/739* | (2006.01) |
| *H01L 29/201* | (2006.01) |

(52) U.S. Cl.
CPC ........ *H01L 27/092* (2013.01); *H01L 21/02381* (2013.01); *H01L 21/02549* (2013.01); *H01L 21/02636* (2013.01); *H01L 21/8258* (2013.01); *H01L 29/66356* (2013.01); *H01L 29/7391* (2013.01); *H01L 21/02466* (2013.01); *H01L 29/201* (2013.01)

(58) Field of Classification Search
CPC .............. H01L 27/092; H01L 21/8258; H01L 29/66356
USPC .......................................................... 257/369
See application file for complete search history.

(56) References Cited

U.S. PATENT DOCUMENTS

| | | | |
|---|---|---|---|
| 2003/0025131 A1* | 2/2003 | Lee et al. ........................ 257/200 |
| 2007/0108526 A1* | 5/2007 | Kohyama ....................... 257/351 |
| 2011/0042757 A1 | 2/2011 | Tan et al. | |
| 2012/0138899 A1* | 6/2012 | Nainani et al. .................. 257/24 |

OTHER PUBLICATIONS

Adachi, "Properties of Semiconductor Alloys: Group-IV, III-V and II-VI Semiconductors," Apr. 2009, p. 366, Wiley.

* cited by examiner

*Primary Examiner* — Nathan Ha
(74) *Attorney, Agent, or Firm* — Innovation Counsel LLP

(57) ABSTRACT

A transistor device may include a first source portion including a first InSb material set and a first first-type dopant set. The transistor device may include a first drain portion including a second InSb material set and a first second-type dopant set. The transistor device may include a first gate and a corresponding first channel portion disposed between the first source portion and the first drain portion and including a third InSb material set. The transistor device may include a second drain portion including a first GaSb material set and a second first-type dopant set. The transistor device may include a second source portion including a second GaSb material set and a second second-type dopant set. The transistor device may include a second gate and a corresponding second channel portion disposed between the second source portion and the second drain portion and including a third GaSb material set.

9 Claims, 6 Drawing Sheets

TUNNELING FIELD EFFECT TRANSISTOR DEVICE AND RELATED MANUFACTURING METHOD

CROSS-REFERENCE TO RELATED APPLICATIONS

This application claims priority to and benefit of Chinese Patent Application No. 201310428652.0, filed on Sep. 22, 2013, the Chinese Patent Application being incorporated herein by reference in its entirety.

BACKGROUND OF THE INVENTION

1. Field of the Invention

The present invention is related to a semiconductor device and a manufacturing method thereof. In particular, the present invention is related to a tunneling field effect transistor (TFET) device and a method for manufacturing the TFET device.

2. Description of the Related Art

Generally, a tunneling field effect transistor (TFET) may be a gate-controlled reverse-biased PIN diode. FIG. 1 illustrates a schematic diagram that illustrates a structure of a TFET. The schematic diagram may represent a cross-section that is taken alone the channel direction of the TFET. In the TFET, the N$^+$ doped region is a drain region, and the P$^+$ doped region in a source area. FIG. 2A and FIG. 2B illustrate operation of the TFET illustrated in FIG. 1. As illustrated in FIG. 2A, when a positive gate bias is applied, the potential of the channel region may be reduced, such that the barrier between the source region and the channel region may become substantially thin. As a result, electrons can tunnel from the source region to the channel region and then drift to the drain region under the effect of the electric field. OFF state. As illustrated in FIG. 2B, the barrier between the source region and the channel region may become substantially thick, such that tunneling may not occur.

In comparison with a conventional metal-oxide-semiconductor field-effect transistor (MOSFET), a TFET may have a relatively smaller sub-threshold swing (SS) and therefore may have a relatively smaller on-state-off-state voltage swing. At room temperature, the minimum SS of a conventional MOSFET may be 60 mV/dec, and the minimum SS of a TFET may be smaller than 60 mV/dec.

Advantages of a TFET may include low leakage current, small SS, low power consumption, etc. Nevertheless, conventional TFETs are typically based on lateral tunneling. Limited by tunneling area and tunneling probability, the on-state current of a conventional TFET may be undesirably small, such that application of a conventional TFET device may be limited.

SUMMARY

An embodiment of the present invention may be related to a transistor device (e.g., a tunneling field effect transistor) that may include a first source portion that includes a first InSb material set and a first first-type dopant set. The transistor device may further include a first drain portion that includes a second InSb material set and a first second-type dopant set. The transistor device may further include a first channel portion that is disposed between the first source portion and the first drain portion and includes a third InSb material set. The transistor device may further include a first gate member that overlaps the first channel portion. The transistor device may further include a second drain portion that includes a first GaSb material set and a second first-type dopant set. The transistor device may further include a second source portion that includes a second GaSb material set and a second second-type dopant set. The transistor device may further include a second channel portion that is disposed between the second source portion and the second drain portion and includes a third GaSb material set. The transistor device may further include a second gate member that overlaps the second channel portion.

The transistor device may include the following elements: a first oxide layer disposed between the first channel portion and the first gate member, wherein a dielectric constant of the first oxide layer is greater than or equal to 3.9; and a second oxide layer disposed between the second channel portion and the second gate member, wherein a dielectric constant of the second oxide layer is greater than or equal to 3.9.

The transistor device may include the following elements: a first spacer and a second spacer, wherein the first gate member and the first oxide layer are disposed between the first spacer and the second spacer; and a third spacer and a fourth spacer, wherein the second gate member and the second oxide layer are disposed between the third spacer and the fourth spacer.

The transistor device may include the following elements: a silicon base substrate; and a SiGe layer disposed between the silicon base substrate and the first channel portion.

The transistor device may include the following elements: a silicon base substrate; and a Ge layer disposed between the silicon base substrate and the first channel portion.

Each of the first first-type dopant set and the second first-type dopant set may include an n-type (i.e., donor type) dopant, and each of the first second-type dopant set and the second second-type dopant set may include a p-type (i.e., acceptor type) dopant.

Each of the first first-type dopant set and the second first-type dopant set may include a p-type (i.e., acceptor type) dopant, and each of the first second-type dopant set and the second second-type dopant set may include an n-type (i.e., donor type) dopant.

The transistor device may include a trench isolation element. The trench isolation element may include an oxide and may be disposed between the first channel portion and the second channel portion. The trench isolation element may be disposed between the first source portion and the second drain portion and may directly contact each of the first source portion and the second drain portion.

A dopant concentration of each of the first source portion, the first drain portion, the second source portion, and the second drain portion may be greater than or equal to $1 \times 10^{19}$ cm$^{-3}$.

An embodiment of the present invention may be related to a method for manufacturing a transistor device. The method may include the following steps: forming an InSb layer on a substrate; forming a GaSb layer on the substrate; forming a first gate member that partially overlaps the InSb layer, such that a first portion of the InSb layer and a second portion of the InSb layer are not covered by the first gate member; forming a second gate member that partially overlaps the GaSb layer, such that a first portion of the GaSb layer and a second portion of the GaSb layer are not covered by the second gate member; doping a first first-type dopant set in the first portion of the InSb layer; doping a first second-type dopant set in the second portion of the InSb layer; doping a second first-type dopant set in the second portion of the GaSb layer; and doping a second second-type dopant set in the first portion of the GaSb layer.

The method may include the following steps: forming a first oxide layer on the InSb layer before the forming the first gate member, wherein a dielectric constant of the first oxide layer is greater than or equal to 3.9; forming the first gate member on the first oxide layer; forming a second oxide layer on the GaSb layer before the forming the second gate member, wherein a dielectric constant of the second oxide layer is greater than or equal to 3.9; and forming the second gate member on the second oxide layer.

The method may include the following steps: forming a first spacer that covers a first side of the first gate member and covers a first side of the first oxide layer; forming a second spacer that covers a second side of the first gate member and covers a second side of the first oxide layer; forming a third spacer that covers a first side of the second gate member and covers a first side of the second oxide layer; and forming a fourth spacer that covers a second side of the second gate member and covers a second side of the second oxide layer.

A third portion of the InSb layer may be covered by the first gate member, may be disposed between the first portion of the InSb layer and the second portion of the InSb layer, and may form a channel portion of an n-type tunneling field effect transistor. A third portion of the GaSb layer may be covered by the second gate member, may be disposed between the first portion of the GaSb layer and the second portion of the GaSb layer, and may form a channel portion of a p-type tunneling field effect transistor.

At least one of the step of forming the InSb layer and the step of forming the GaSb layer may include performing selective epitaxial growth.

The substrate may include a silicon base substrate, a Ge layer, and a SiGe layer positioned between the silicon base substrate and the Ge layer.

Each of the first first-type dopant set and the second first-type dopant set may include n-type dopant elements (i.e., donors), and each of the first second-type dopant set and the second second-type dopant set may include p-type dopant elements (i.e., acceptors).

Each of the first first-type dopant set and the second first-type dopant set may include p-type dopant elements (i.e., acceptors), and each of the first second-type dopant set and the second second-type dopant set may include n-type dopant elements (i.e., donors).

A dopant concentration of each of the first first-type dopant set in the first portion of the InSb layer, the first second-type dopant set in the second portion of the InSb layer, the second first-type dopant set in the second portion of the GaSb layer, and the second second-type dopant set in the first portion of the GaSb layer may be at least $1 \times 10^{19}$ cm$^{-3}$.

The first portion of the InSb layer may form a source portion of an n-type tunneling field effect transistor. The second portion of the GaSb layer may form a drain portion of a p-type tunneling field effect transistor.

The first portion of the InSb layer and the second portion of the GaSb layer may be positioned between the second portion of the InSb layer and the first portion of the GaSb layer.

The above summary is related to some of the many embodiments of the invention disclosed herein and is not intended to limit the scope of the invention, which is set forth in the claims herein. These and other features of the present invention will be described in more detail below in the detailed description of the invention and in conjunction with figures.

BRIEF DESCRIPTION OF THE DRAWINGS

Embodiments of present invention are illustrated by way of example, and not by way of limitation, in the figures of the accompanying drawings and in which like reference numerals/characters may refer to similar elements and in which.

DETAILED DESCRIPTION

The present invention will now be described in detail with reference to a few embodiments thereof as illustrated in the accompanying drawings. In the following description, specific details are set forth in order to provide a thorough understanding of the present invention. It will be apparent, however, to one skilled in the art, that the present invention may be practiced without some or all of these specific details. In some instances, well known process steps and/or structures have not been described in detail in order to avoid unnecessarily obscuring the present invention.

Although the terms "first", "second", etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms "first", "second", etc. may also be used herein to differentiate different categories of elements. For conciseness, the terms "first", "second", etc. may represent "first-type (or first-category)", "second-type (or second-category)", etc., respectively.

Various embodiments are described herein below, including methods and techniques. Embodiments of the invention might also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1:
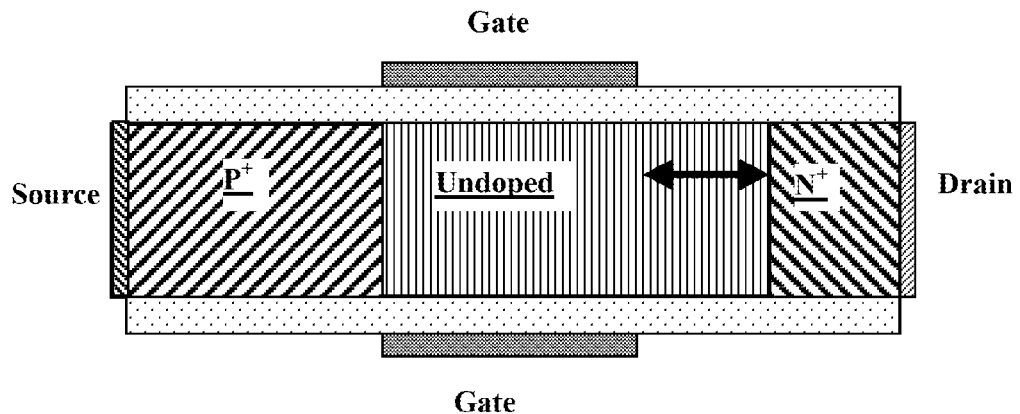
FIG. 1 illustrates a schematic diagram that illustrates a structure of a TFET.
Figure 2A:
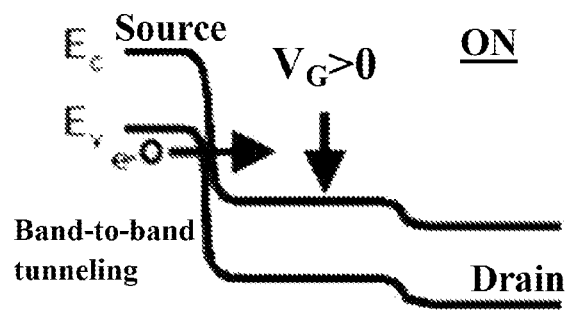
FIG. 2A and FIG. 2B illustrate operation of the TFET illustrated in FIG. 1.
Figure 2B:
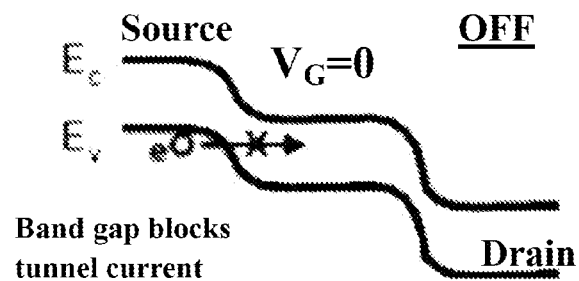
Figure 3:
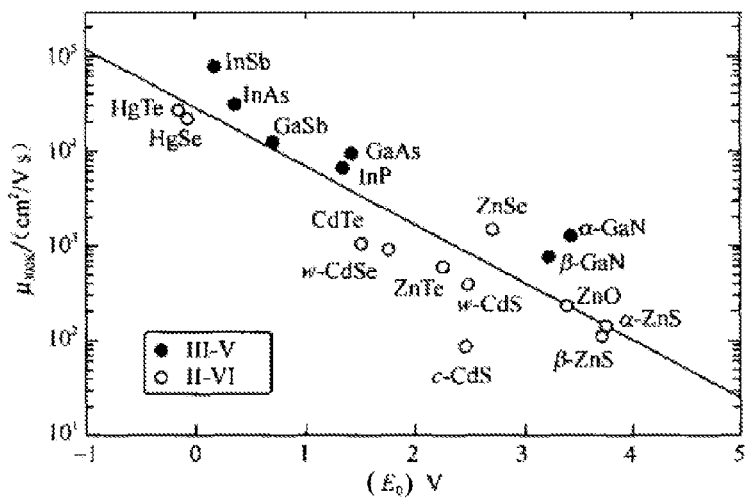
FIG. 3 illustrates relations between carrier mobility and direct band gap energy associated with several semiconductors at room temperature.

FIG. 3 illustrates relations between carrier mobility (represented by the vertical axis) and direct band gap energy (represented by the horizontal axis) associated with several semiconductors at room temperature (300 K). In FIG. 3, the solid line represents the least-squares fit with ln $\mu_{300K}$ (i.e., $\log_e \mu_{300K}$)=10.3−1.41$E_0$, wherein direct band gap energy values E0 are in eV, and wherein carrier mobility values $\mu_{300K}$ are in cm$^2$/V s).

As can be appreciated from FIG. 3, GaSb, as a narrow-band-gap direct-band-gap semiconductor material, has high carrier (hole) mobility at low electric field, while InSb, as a narrow-band-gap direct-band-gap semiconductors material, has high carrier (electron) mobility at low electric field. Therefore, in an embodiment of the present invention, GaSb may be used for forming a p-type TFET (pTFET), and InSb may be used for forming an n-type TFET (nTFET).

Figure 4:
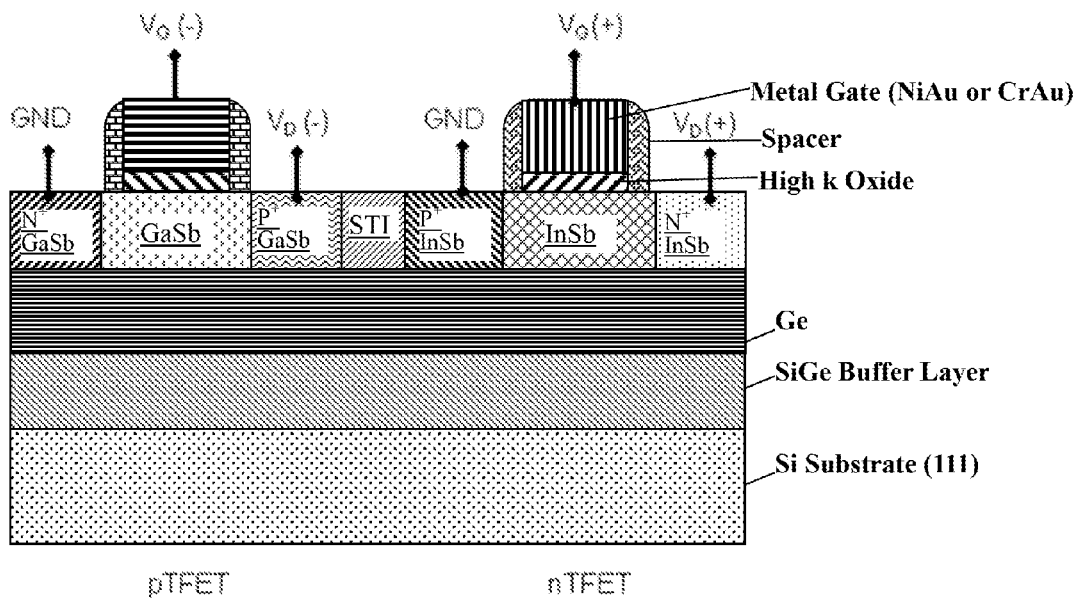
FIG. 4 shows a schematic diagram that illustrates a TFET device in accordance with an embodiment of the present invention.

FIG. 4 shows a schematic diagram that illustrates a TFET device in accordance with an embodiment of the present invention. The schematic diagram may represent a cross-section or may represent an elevational view (e.g., a front view or a side view) that illustrates a structure of the TFET device. The TFET may be a complementary TFET that includes an nTFET and a pTFET and has a substantially high mobility rate. In the example illustrated in FIG. 4, both the nTFET and the pTFET are on, wherein VG>0 and VD>0 for the nTFET, and wherein VG<0 and VD<0 for the pTFET.

As illustrated in FIG. 4, the nTFET may include a first channel region (InSb) formed of InSb, a first metal gate (Metal Gate) that overlaps the first channel region/portion, a first source region/portion (P$^+$ InSb) formed of P$^+$ doped InSb, and a first drain region/portion (N$^+$ InSb) formed of N$^+$ doped InSb. The pTFET may include a second channel region/portion (GaSb) formed of GaSb, a second metal gate (Metal Gate) that overlaps the second channel region, a second drain region/portion (P$^+$ GaSb) formed of P$^+$ doped GaSb, and a second source region/portion (N$^+$ GaSb) formed of N$^+$ doped GaSb. Each of the first metal gate and the second metal gate may be formed of NiAu, CrAu, or an alternative metal or alloy. The doping concentration of each of the P$^+$ dopant (i.e., high-concentration acceptor dopant) and the N$^+$ dopant (i.e., high-concentration donor dopant) may be at least $1\times10^{19}$ cm$^{-3}$.

A shallow trench isolation element (STI) may be disposed between the nTFET and the pTFET to isolate (and electrically insulate) the nTFET and the pTFET from each other. The STI may include an oxide.

Elements of each of the nTFET 禾 pTFET may be formed on a substrate that may include a silicon base substrate (Si Substrate), a SiGe buffer layer (SiGe Buffer Layer), and a Ge layer (Ge). The silicon substrate may include silicon that has a 111 crystal structure.

A high k oxide layer (High k Oxide) may be disposed between each channel region and the corresponding metal gate. The metal gate and the high k oxide layer may be disposed between two spacers (Spacers). The high k oxide layer may be formed of a high k oxide with a dielectric constant higher than the dielectric constant of silicon oxide and/or greater than or equal to 3.9.

Figure 5:
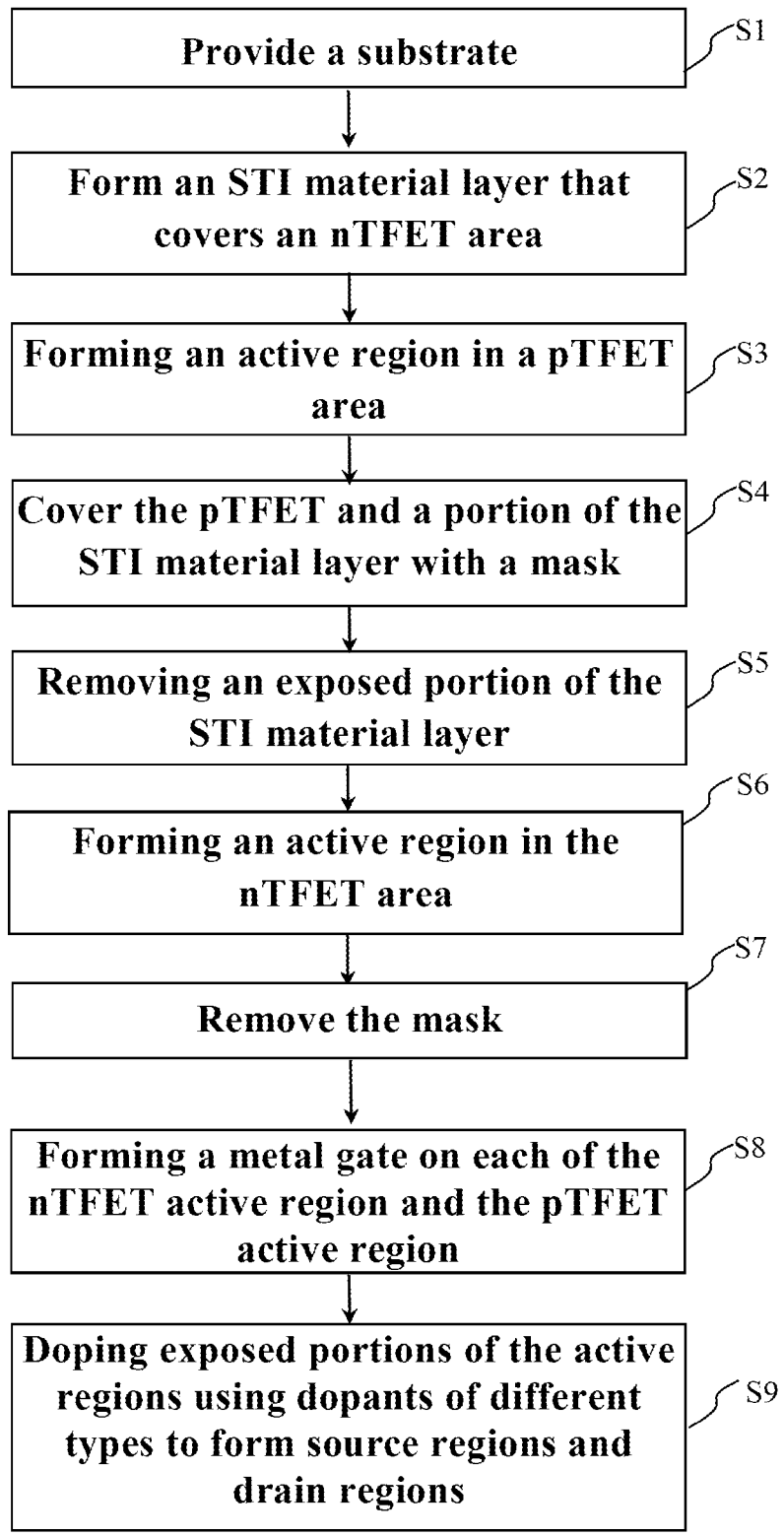
FIG. 5 shows a schematic flowchart that illustrates a method for manufacturing a TFET device in accordance with an embodiment of the present invention.

FIG. 5 shows a schematic flowchart that illustrates a method for manufacturing a TFET device in accordance with an embodiment of the present invention. FIG. 6A, FIG. 6B, FIG. 6C, FIG. 6D, FIG. 6E, FIG. 6F, and FIG. 6G show schematic diagrams that illustrate structures formed during the manufacturing of the TFET device in accordance with an embodiment of the present invention. FIGS. 6A-6G may represent cross-sections and/or elevational views that illustrate the structures.

Figure 6A:
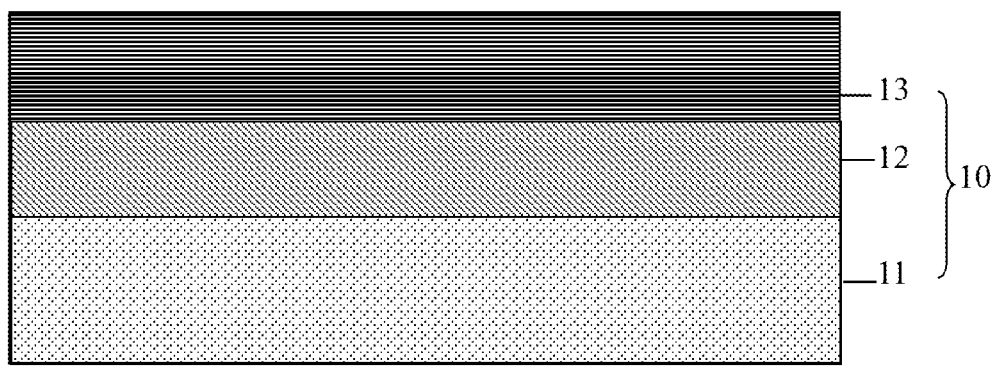
FIG. 6A, FIG. 6B, FIG. 6C, FIG. 6D, FIG. 6E, FIG. 6F, and FIG. 6G show schematic diagrams that illustrate structures formed during the manufacturing of a TFET device in accordance with an embodiment of the present invention.

Referring to FIG. 5 and FIG. 6A, the method may include, in step S1, providing a substrate 10. The substrate 10 may include a silicon base substrate 11, a SiGe buffer layer 12, and a Ge layer 13. The SiGe buffer layer 12 may be positioned between the silicon base substrate 11 and the SiGe buffer layer 12, and a Ge layer 13. The SiGe buffer layer 12 and/or the Ge layer 13 may be form on the silicon base layer through epitaxial growth. The thickness of the SiGe buffer layer 12 may be in a range of 1 to 5 µm. The thickness of the Ge layer 12 may be in a range of 1 to 5 µm.

Figure 6B:
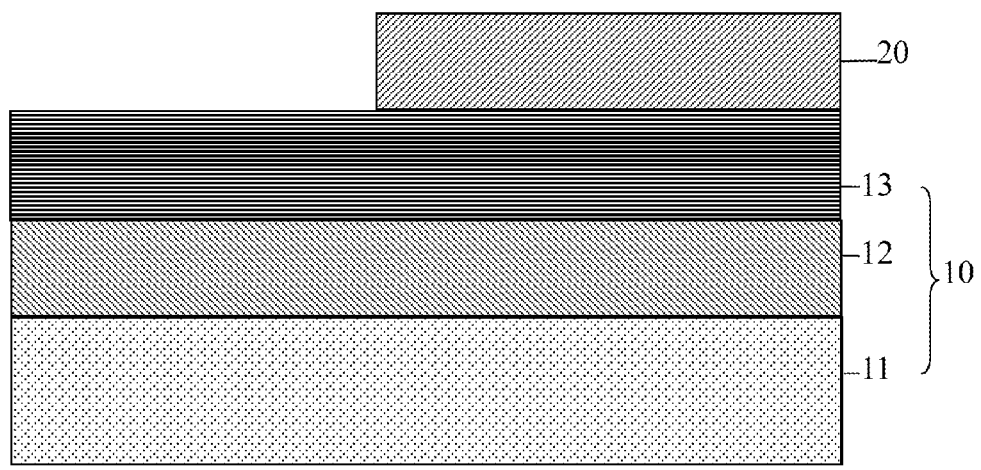

Subsequently, referring to FIG. 5 and FIG. 6B, the method may include, in step S2, depositing and patterning an STI material 20 on the substrate 10 to form an STI material 20 layer that covers a predetermined area designated for forming an nTFET or a pTFET. An exposed area of the substrate 10 may not be covered by the STI material 20 layer. In an embodiment, the STI material 20 layer may cover a predetermined area designated for forming an nTFET, or an nTFET area; the exposed area may be a predetermined area designated for forming a pTFET, or a pTFET area. The STI material 20 may be an oxide.

Figure 6C:
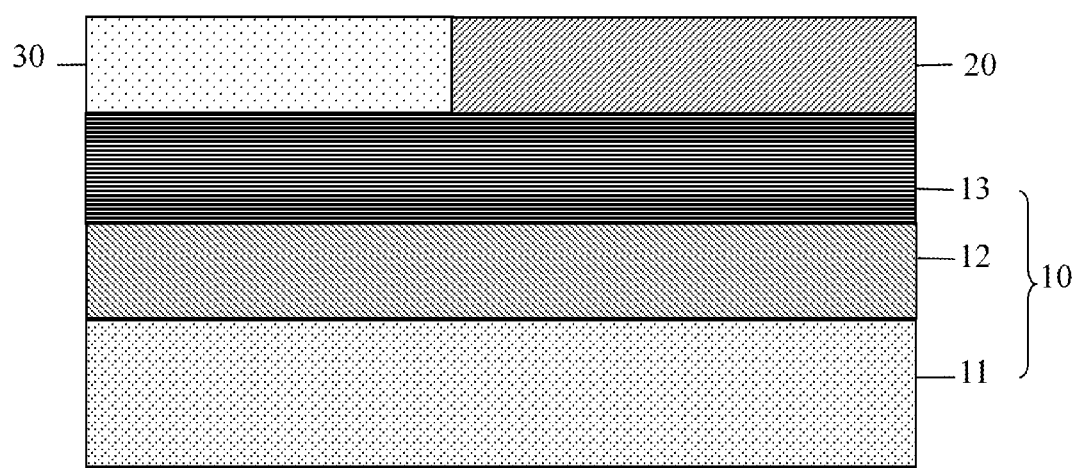

Subsequently, referring to FIG. 5 and FIG. 6C, the method may include, in step S3, forming an active region/layer 30 on the exposed area (e.g., the pTFET area) through selective epitaxial growth. The active region 30 may represent a GaSb active region of the pTFET to be formed. The thickness of the active region 30 may be in a range of 10 to 1000 nm. The selective epitaxial growth process may include a molecular beam epitaxy (MBE) process and/or a metal organic chemical vapor deposition (MOCVD) process.

Figure 6D:
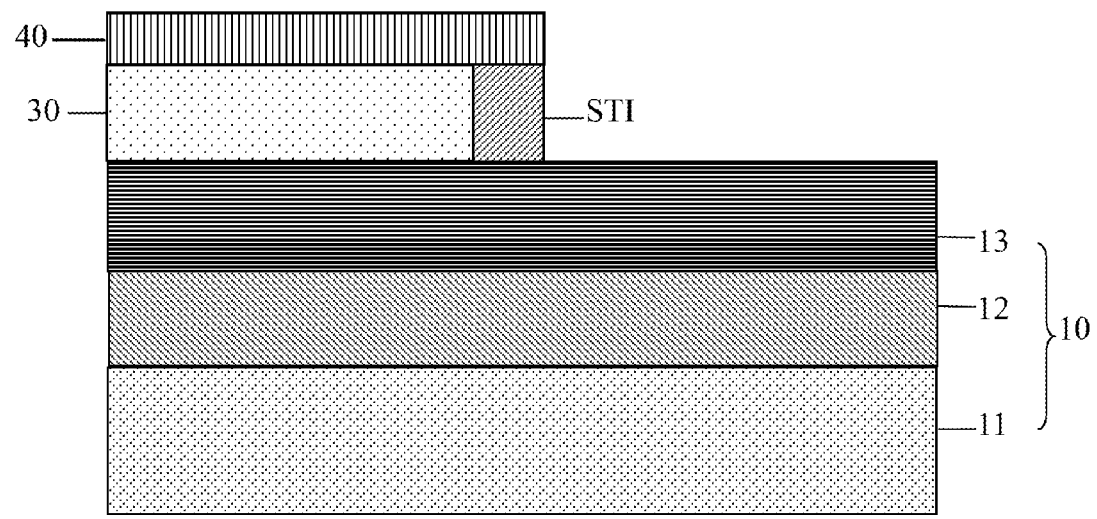

Subsequently, referring to FIG. 5 and FIG. 6D, the method may include, in step S4, forming a mask 40 to cover the pTFET area and a portion of the STI material 20 layer. The mask 40 may be formed of a nitride and may have a thickness in a range of 10 to 100 nm. An exposed portion of the STI material 20 layer may not be covered by the mask 40. The method may include, in step S5, removing the exposed portion of the STI material 20 layer, such that the nTFET area of the substrate 10 may be exposed (and a remaining portion of the STI material 20 may form an STI).

Figure 6E:
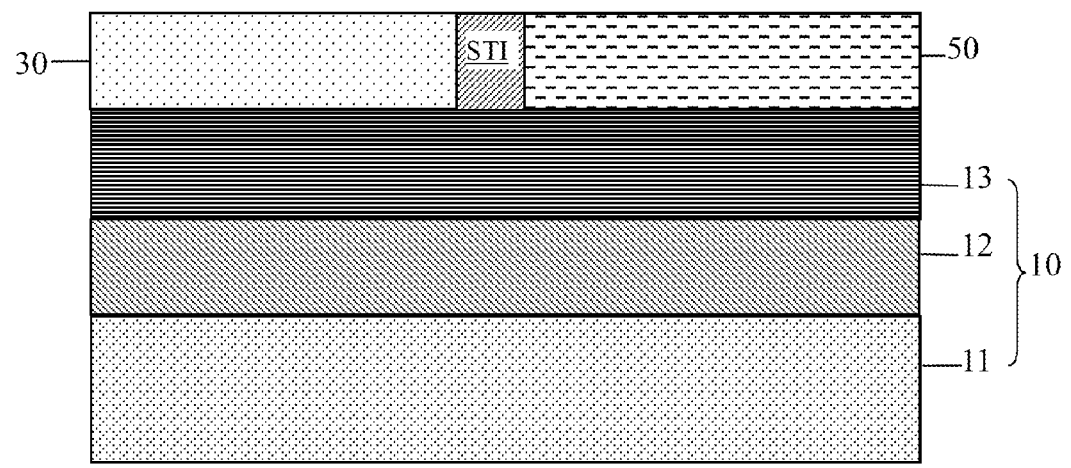

Subsequently, referring to FIG. 5 and FIG. 6E, the method may include, in Step S6, forming an active region/layer 50 in the exposed nTFET area on the substrate 10 through selective epitaxial growth. The active region 50 may represent an InSb active region of the nTFET to be formed. The thickness of the active region 50 may be in a range of 10 to 1000 nm. The selective epitaxial growth process may include an MBE process and/or an MOCVD process. The method may include, in step S7, removing the mask 40. As a result, a structure that includes the active region 30 (e.g., the GaSb active region of the pTFET), the active region 50 (e.g., the InSb active region of the nTFET), and an STI disposed between the active regions may be formed.

Figure 6F:
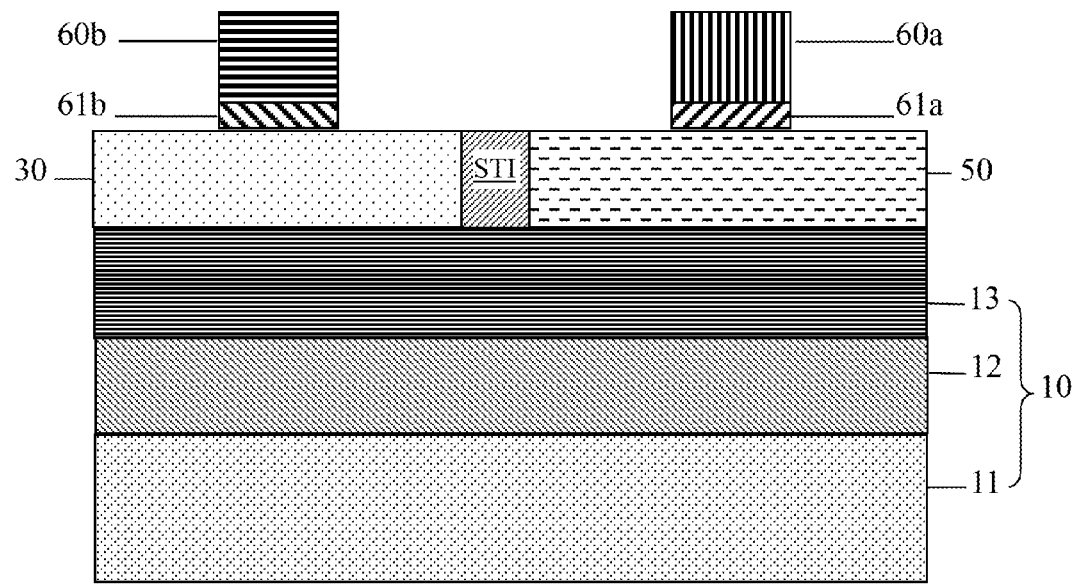

Subsequently, referring to FIG. 5 and FIG. 6F, the method may include, in step S8, forming a metal gate 60a and a metal gate 60b on (or over) the active region 50 and the active region 30, respectively. Each of the metal gate 60a and the metal gate 60b may be formed of NiAu, CrAu, or an alternative metal or alloy. The metal gate 60a and the metal gate 60b may be formed on a high k oxide layer 61a and a high k oxide layer 61b, respectively. The high k oxide layer 61a and the high k oxide layer 61b may be formed on the active region 50 and the active region 30, respectively.

Subsequently, referring to FIG. 5 and FIG. 6G, the method may include, in step S9, performing doping at exposed portions of the active region 50 and the active region 30 that are not covered by the metal gate 60a and 60b. Exposed portions at different sides of each metal gate may be doped with dopants of different types. As a result, the doped portions may form a source region 71a, a drain region 72a, a source region 71b, and drain region 72b. A portion of the active region 50 that is covered by the metal gate 60a may be undoped and may form a channel region 70a between the source region 71a and the drain region 72a. A portion of the active region 30 that is covered by the metal gate 60b may be undoped and may form a channel region 70b between the source region 71b and the drain region 72b.

Prior to the doping, spacers 62a may be formed on sides of the metal gate 60a and the high k oxide layer 61a, and spacers 62b may be formed on sides of the metal gate 60b and the high k oxide layer 61b, for protecting the metal gates and the high k oxide layers.

Figure 6G:
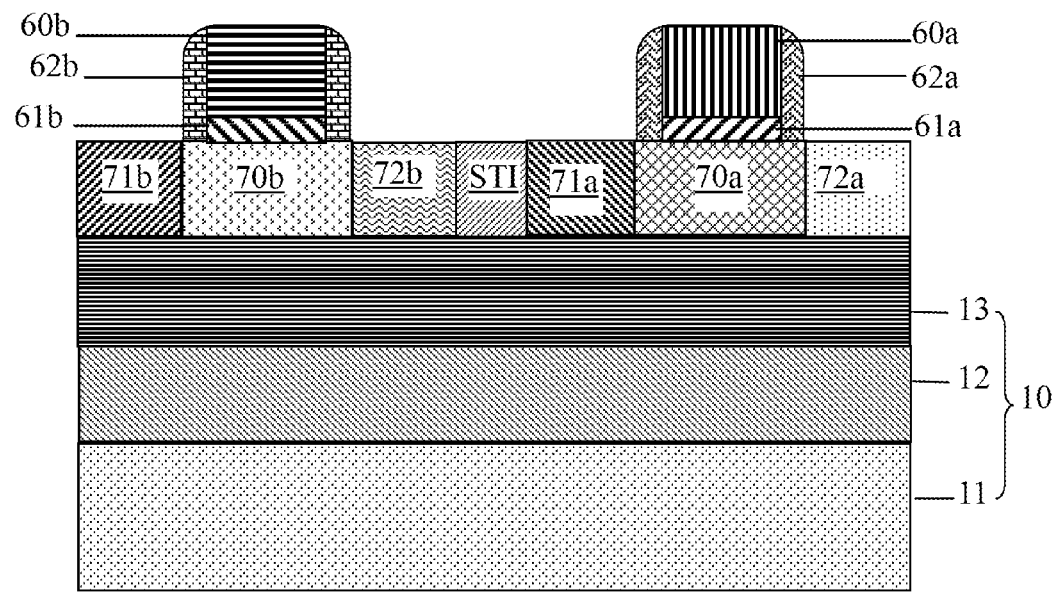

Referring to FIG. 4 and FIG. 6G, the $P^+$ doping may be formed through ion implantation using $Mg^+$ ions, energy in a range of 2 to 10 keV, and dose in a range of $1 \times 10^{15}$ $cm^{-2}$ to $5 \times 10^{16}$ $cm^{-2}$; the $N^+$ doping may be formed through ion implantation using $Si^-$ ions, energy in a range of 2 to 50 keV, and dose in a range of $1 \times 10^{15}$ $cm^{-2}$ to $5 \times 10^{16}$ $cm^{-2}$. As a result, the doping concentration of each of the $P^+$ dopant (i.e., high-concentration acceptor dopant) and the $N^+$ dopant (i.e., high-concentration donor dopant) may be at least $1 \times 10^{19}$ $cm^{-3}$.

After the doping, annealing may be performed on the doped structure, such that characteristics of the resulted TFET device may be optimized.

As can be appreciated from the foregoing, embodiments of the present invention may include GaSb in a pTFET and/or may include InSb in an nTFET. Therefore, embodiments of the present invention may have substantially high carrier mobility and therefore substantially high on-state current. Advantageously, embodiments of the invention may be utilized in a substantially wide range of applications.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section may be provided herein for convenience and, due to word count limitation, may be accordingly written for reading convenience and should not be employed to limit the scope of the claims. The following appended claims should be interpreted as including all alternations, permutations, and equivalents that fall within the true spirit and scope of the present invention.

What is claimed is:

1. A transistor device comprising:
   a first source portion including a first InSb material set and a first first-type dopant set;
   a first drain portion including a second InSb material set and a first second-type dopant set;
   a first channel portion disposed between the first source portion and the first drain portion and including a third InSb material set;
   a first gate member overlapping the first channel portion;
   a second drain portion including a first GaSb material set and a second first-type dopant set;
   a second source portion including a second GaSb material set and a second second-type dopant set;
   a second channel portion disposed between the second source portion and the second drain portion and including a third GaSb material set; and
   a second gate member overlapping the second channel portion.

2. The transistor device of claim 1, further comprising:
   a first oxide layer disposed between the first channel portion and the first gate member, wherein a dielectric constant of the first oxide layer is greater than or equal to 3.9; and
   a second oxide layer disposed between the second channel portion and the second gate member, wherein a dielectric constant of the second oxide layer is greater than or equal to 3.9.

3. The transistor device of claim 2, further comprising:
   a first spacer and a second spacer, wherein the first gate member and the first oxide layer are disposed between the first spacer and the second spacer; and
   a third spacer and a fourth spacer, wherein the second gate member and the second oxide layer are disposed between the third spacer and the fourth spacer.

4. The transistor device of claim 1, further comprising:
   a silicon base substrate; and
   a SiGe layer disposed between the silicon base substrate and the first channel portion.

5. The transistor device of claim 1, further comprising:
   a silicon base substrate; and
   a Ge layer disposed between the silicon base substrate and the first channel portion.

6. The transistor device of claim 1, wherein each of the first first-type dopant set and the second first-type dopant set includes an n-type dopant, and wherein each of the first second-type dopant set and the second second-type dopant set includes a p-type dopant.

7. The transistor device of claim 1, wherein each of the first first-type dopant set and the second first-type dopant set includes a p-type dopant, and wherein each of the first second-type dopant set and the second second-type dopant set includes an n-type dopant.

8. The transistor device of claim 1, further comprising: a trench isolation element including an oxide and disposed between the first channel portion and the second channel portion.

9. The transistor device of claim 1, wherein a dopant concentration of each of the first source portion, the first drain portion, the second source portion, and the second drain portion is at least $1 \times 10^{19}$ $cm^{-3}$.

* * * * *